(12) United States Patent
Morzheim et al.

(10) Patent No.: US 6,853,779 B2
(45) Date of Patent: Feb. 8, 2005

(54) FLOATING OPTICAL CARRIER

(75) Inventors: Kristofer Morzheim, Vacaville, CA (US); Kelvin Chau, Pleasanton, CA (US)

(73) Assignee: Onix Microsystems, Richmond, CA (US)

( * ) Notice: Subject to any disclaimer, the term of this patent is extended or adjusted under 35 U.S.C. 154(b) by 374 days.

(21) Appl. No.: 10/060,067

(22) Filed: Jan. 29, 2002

(65) Prior Publication Data

US 2002/0159707 A1 Oct. 31, 2002

Related U.S. Application Data

(63) Continuation-in-part of application No. 09/514,424, filed on Feb. 28, 2000, now Pat. No. 6,375,365.

(51) Int. Cl.[7] ................................................. G02B 6/26
(52) U.S. Cl. ............................. 385/52; 385/14; 385/88
(58) Field of Search .............................. 385/14, 52, 80, 385/88–94

(56) References Cited

U.S. PATENT DOCUMENTS

| | | | |
|---|---|---|---|
| 4,240,098 A | 12/1980 | Zory et al. .................... 357/74 |
| 4,347,655 A | 9/1982 | Zory et al. .................... 29/589 |
| 4,758,063 A | 7/1988 | Konechny ................. 350/96.2 |
| 4,763,412 A | 8/1988 | Basavanhally et al. ....... 29/845 |
| 5,026,138 A | 6/1991 | Boudreau et al. .......... 350/96.2 |
| 5,042,709 A | 8/1991 | Cina et al. ................... 228/105 |
| 5,247,597 A | 9/1993 | Blacha et al. ................. 385/88 |
| 5,388,174 A * | 2/1995 | Roll et al. ..................... 385/80 |
| 5,611,006 A | 3/1997 | Tabuchi ....................... 385/14 |
| 5,692,084 A | 11/1997 | Roff ............................. 385/88 |
| 5,768,456 A | 6/1998 | Knapp et al. ................. 385/49 |
| 5,864,642 A | 1/1999 | Chun et al. ................... 385/14 |
| 6,375,365 B1 * | 4/2002 | Chau ............................ 385/88 |

OTHER PUBLICATIONS

Marchand et al., Packaging for 3D Optoelectronic Stacked Processors, Jan. 1999, pp 142–147. Part of the SPIE Conference on Photonics Packaging and Integration.

* cited by examiner

Primary Examiner—Phan T. H. Palmer

(57) ABSTRACT

An apparatus and method for aligning one or more optical fibers is disclosed. The apparatus includes a carrier having one or more through holes and one or more plugs, each of which is sized to be received in one or more of the three or more through holes. The carrier is adapted to receive one or more waveguides. The waveguides may be aligned by inserting a plug into each of one or more through holes in a carrier; attaching a waveguide to the carrier; aligning the carrier to align the one or more waveguides with respect to an optical device attached to a substrate; and tacking one or more of the plugs to the substrate to maintain the alignment of the waveguides with respect to the optical device.

29 Claims, 7 Drawing Sheets

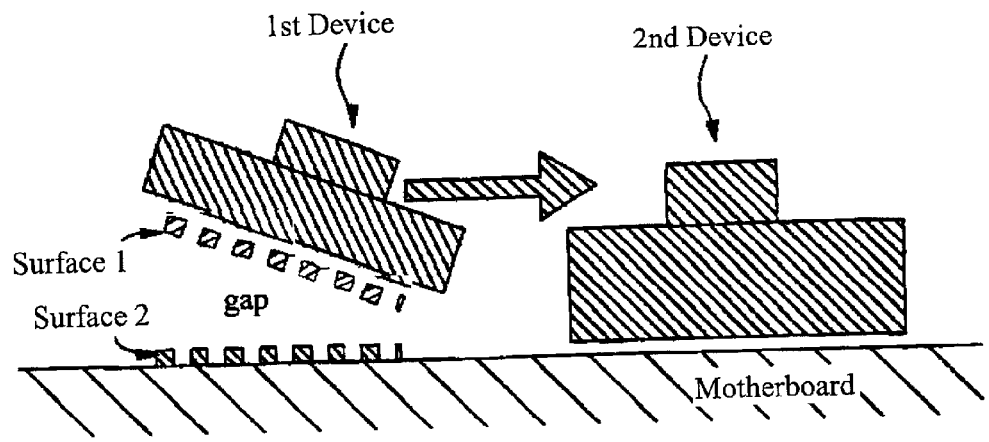
Fig. 1    (Prior Art)
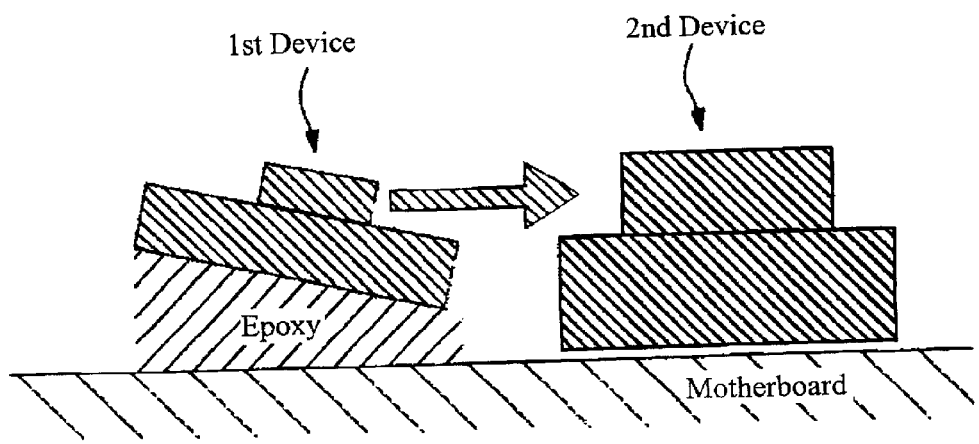
Fig. 2    (Prior Art)

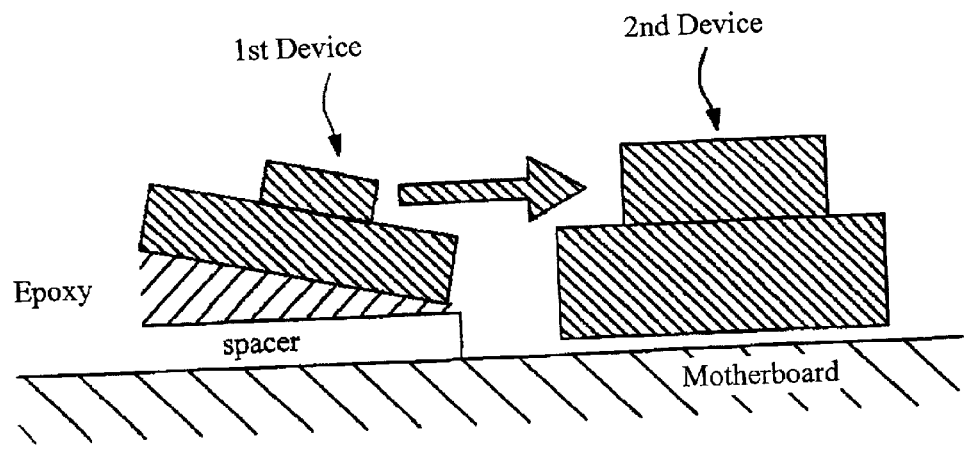
Fig. 3    (Prior Art)
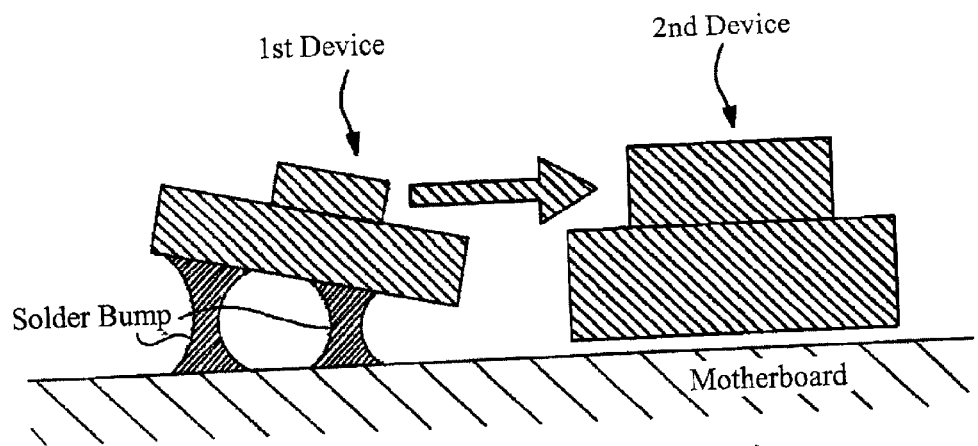
Fig. 4    (Prior Art)

FLOATING OPTICAL CARRIER

CROSS REFERENCE TO A RELATED APPLICATION

This application is a continuation in part of and claims the benefit of U.S. patent application Ser. No. 09/514,424 filed Feb. 28, 2000, now U.S. Pat. No. 6,375,365, the entire disclosures of which are incorporated herein by reference.

FIELD OF THE INVENTION

This invention relates generally to assembly of optical modules. More particularly, it relates to aligning one or more optical fibers to one or more optical devices.

BACKGROUND OF THE INVENTION

For most optoelectronic products manufactured today, coupling light into or out of an optical device is accomplished by active alignment of one device with respect to another. The basic process is to move an object in space angularly and laterally to locate a first device [X,Y,Z] and orient [$\theta_x$, $\theta_y$, $\theta_z$] it with respect to a second device. The device can be held either by mechanical clamp or suction generated by vacuum pump. Special toolings are usually made for particular geometry.

To maintain alignment, the first device has to be permanently fixed on a motherboard. The challenge is to find a suitable mounting technique that will allow sufficient angular and lateral offset as the fixture secured to a motherboard. There are usually arbitrary gaps formed between bonding surfaces of the optical device and the motherboard, as depicted in FIG. 1 of prior art, due to physical impression of parts. In FIG. 1, a first optical device is aligned respect to a second optical device to couple the light into or out of these optical devices. The gap between surface 1 of the first device and surface 2 of the motherboard is formed. These gaps inhibit the aligned assembly from being assembled with solid contacts.

FIGS. 2, 3, and 4 demonstrate various prior art assembly concepts to compensate for such angular and lateral deviations. Typical solutions involve the use of thick epoxy and/or solder and precision spacers. FIG. 2 shows the gap between two bonding surfaces is filled with epoxy. The problem with this approach is that epoxy shrinks during curing. The resulting dislocation could be significant if the gap is large. This shrinkage is generally predictable and could be accounted for in final assembly. However, this can make the assembly process complicated and often unreliable. FIG. 3 depicts enhanced approach that uses a spacer to reduce the overall gap between the optical device and the motherboard. A layer of epoxy fills the subgap between the optical device and the spacer. The thickness of the spacer has to be precise to properly align the first device with respect to the second. Furthermore, shrinkage of the epoxy during curing is still a problem. Another approach, shown in FIG. 4, is to use a solder bump, allowing two surfaces to be bonded with solder reflow at high temperature. Although many advantages of this technology have been realized: high yield, high strength and self-alignment during joining, the initial setup cost is extremely high. Furthermore, the device is not secured to the motherboard during solder reflow and may become misaligned as the solder solidifies. In addition, the solder bump may not be able to withstand large temperature fluctuations due to differences in the coefficients of thermal expansion of the bonding materials. The problem becomes aggravated as the size of solder becomes larger.

There is a need, therefore, for a low cost packaging method to assemble pre-aligned optical modules to a common substrate, by which the optical modules are permanently fixed on the common substrate without dislocation due to temperature variations.

BRIEF DESCRIPTION OF THE FIGURES

The teachings of the present invention can be readily understood by considering the following detailed description in conjunction with the accompanying drawings, in which:

FIG. 1 is a schematic diagram illustrating a prior art assembly showing a gap formed between bonding surfaces during mounting an optical device to a motherboard;

FIG. 2 is a schematic diagram illustrating a prior art showing an assembly method wherein the gap between bonding surfaces is filled with epoxy;

FIG. 3 is a schematic diagram of a prior art assembly showing a spacer used to reduce the overall gap between two bonding surfaces;

FIG. 4 is a schematic diagram illustrating a prior art assembly method wherein solder bump is used to bond two surfaces at high temperature;

DESCRIPTION OF THE SPECIFIC EMBODIMENTS

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 5:
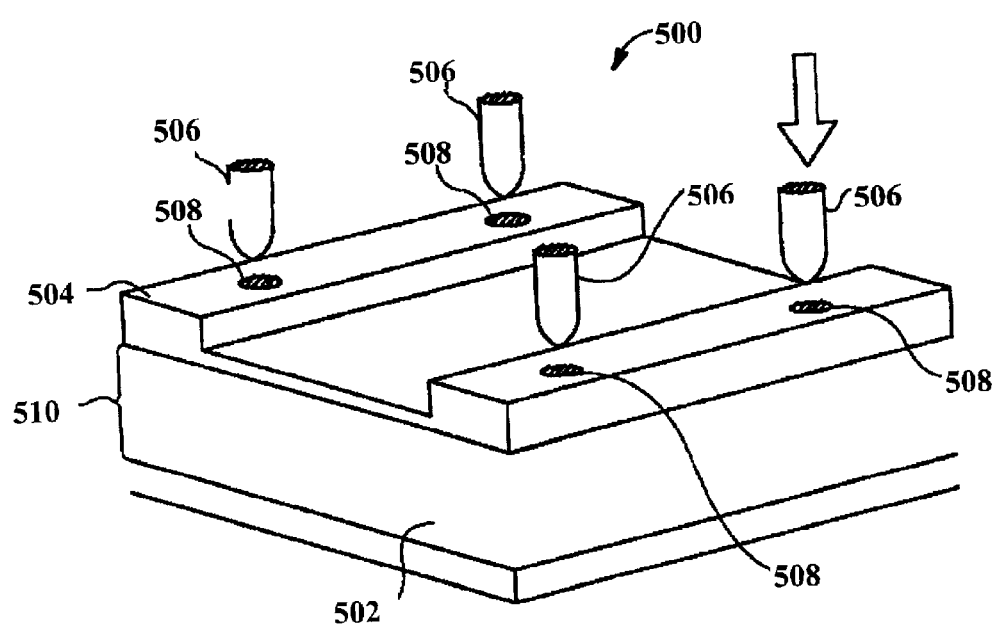
FIG. 5 is a schematic diagram of an apparatus for attachment and alignment of an optical device to a motherboard with the through holes provided in the device carrier according to a first embodiment of the present invention.

Embodiments of the present invention use plugs or pins as adjustable spacers between device carriers and substrates to compensate for possible misalignment. FIG. 5. shows a schematic diagram of an apparatus 500 for attachment and alignment of an optical device to a substrate 502 according to a first embodiment of the present invention. The apparatus 500 generally comprises a device carrier 504 and adjustable plugs 506 used as a bridge connection between the substrate 502 and the device carrier 504. An epoxy or solder may be used to bond the plugs 506 to both the device carrier 504 and the substrate 502. The gap 510 between the device carrier 504 and the substrate 502 may be filled with a filler material such as epoxy or solder.

The device carrier 504 is typically made from a material with a low thermal expansion, which does not expand or contract much with temperature fluctuations, so overall thermal performance is enhanced. The material is also chosen to be a near thermal match or coefficient buffer with the substrate and the device to be attached. This material includes metals, ceramics, polymers, glasses, or silicon. A device, such as a lens array, can be secured in device carrier 504 in a fixed position by any suitable means. The inventors have determined that it is particularly advantageous to make the device carrier 504 from a ceramic or glass material in certain applications.

The plugs 506 are typically made from similar materials to those of the device carrier 504 as described above. Furthermore, to offer as an integral part to existing soldering technique, the plugs 506 could also be plated for soldering or are made from the soldering materials such as tin-lead and gold-tin. The number of plugs used will determine the strength of the attachment. Four have been shown in the design, however more or less could be used. Although generally three or more plugs 506 are used to align the device carrier 504 fewer plugs, including a single plug, may alternatively be used.

As shown in FIG. 5, the through holes 508 are provided on the device carrier 504. The cross-sections of the plugs 506 and through holes 508 are chosen to provide a maximum contact area between them such as square/square or round/round cross-sections. Different geometries may be used depending on the epoxy or solder used. The plugs 506 are inserted into the through holes 508 from the top of the device carrier 504. The plugs 506 closely fit into the holes 508, so the clearance is large enough for the plugs 506 to slip through the holes 508 without much insertion force. The clearance may be made small enough that the plugs 506 may be held in place by the force of friction. In general, however, the clearance between the plugs 506 and the holes 508 can be considered arbitrary and is largely dependant on the chosen adhesives and/or filler materials.

The device carrier 504 is aligned laterally and angularly by using the plugs as an adjustable spacer between the device carrier 504 and the substrate 502. The plugs 506 may then be tacked to the substrate 502 to maintain the alignment of the device carrier 504. The plugs 506 may also be tacked to the device carrier 504. Any suitable means, such as epoxy, solder, or laser welding, may be used to tack the plugs in place. A filler material, such as an epoxy, may fill the space 510 between the device carrier 504 and the substrate 502. The plugs 506 and filler material (if used) secure the device carrier 504 to the substrate 502.

Figure 6:
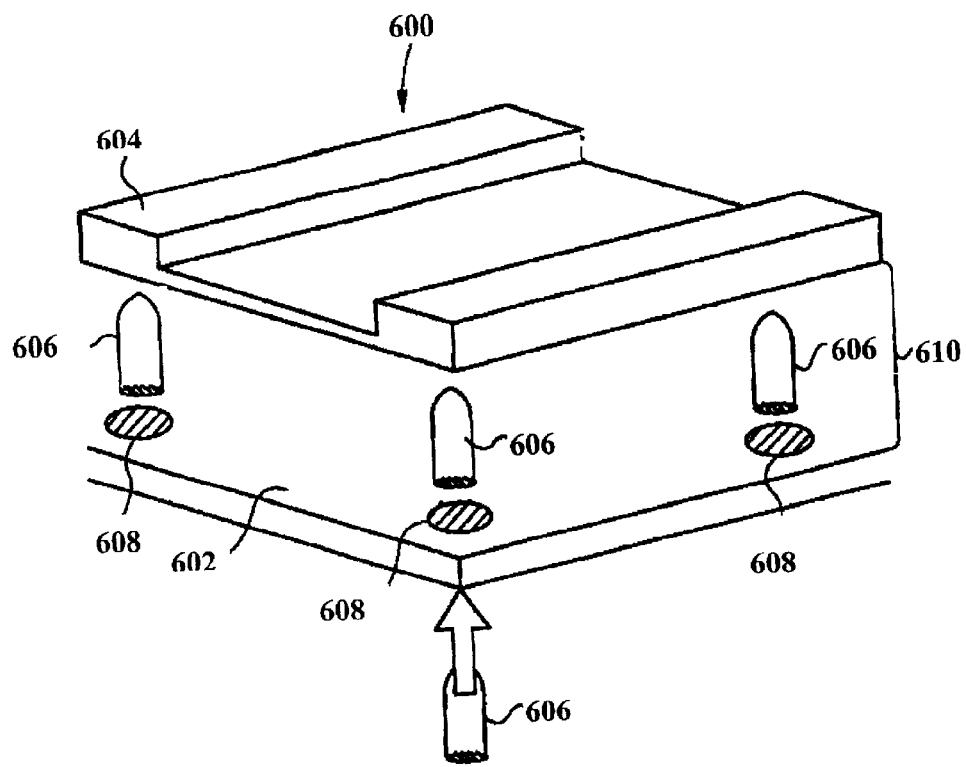
FIG. 6 is a schematic diagram of an apparatus for attachment and alignment of an optical device to a motherboard with the through holes provided in the motherboard according to a second embodiment of the present invention.

FIG. 6 shows a schematic diagram of an apparatus 600 for attachment and alignment of an optical device to a substrate 602 according to a second embodiment of the present invention. The apparatus 600 comprises a device carrier 604 and one or more adjustable plugs 606 used as a bridge connection between the substrate 602 and the device carrier 604. A gap 610 between the device carrier 604 and the substrate 602 may be filled with a filler material such as an epoxy or solder.

The materials for the device carrier 604 and the plugs 606 are similar to the materials of the device carrier 504 and the plugs 506 describe above with respect to FIG. 5.

The method for attachment and alignment of optical devices to the substrate applying to the apparatus 600 is similar to the method applying for the apparatus 500 as described above. The difference between the two methods is that the through holes 608 are provided on the substrate 602, and the plugs 606 are inserted into the holes 608 from the bottom of the substrate 602. The plugs 606 are tacked to the device carrier 604 and/or the substrate 602 to secure the alignment of the device.

Figure 7:
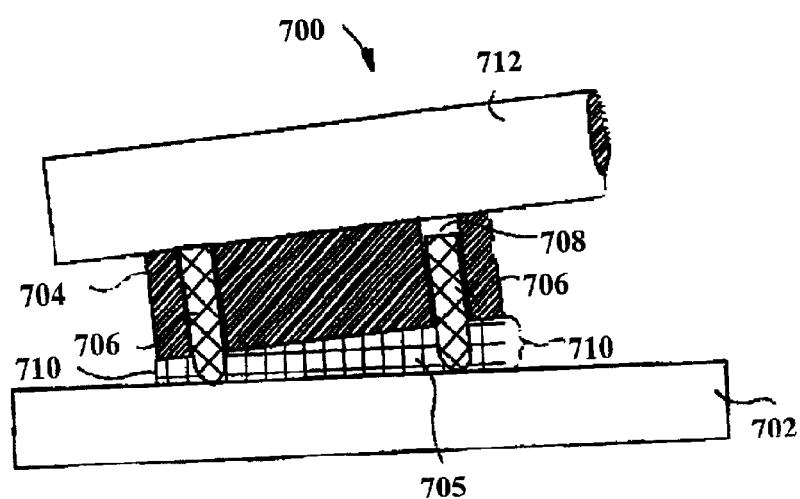
FIG. 7 is a cross-sectional schematic diagram showing the use of adjustable plugs as a connection bridge between a device carrier and a motherboard according to an embodiment of the present invention.

A method of utilizing the plugs as a connection bridge between the device carrier and the substrate described above is shown in cross-sectional diagram 700 in FIG. 7. In FIG. 7, an optical device 712, which is secured to a device carrier 704, is connected and aligned relative to a substrate 702 by plugs 706. The plugs 706 are inserted into through holes 708, which are provided in the device carrier 704. A filler material 705, such as epoxy or solder, fills a gap 710 between the device carrier 704 and the substrate 702. The plugs 706 can slip up and down in the through holes 708 during the movement of the device carrier 704 relative to the substrate 702. The plugs 706 serve as an adjustable spacer between the device carrier 704 and the substrate 702.

Figure 8:
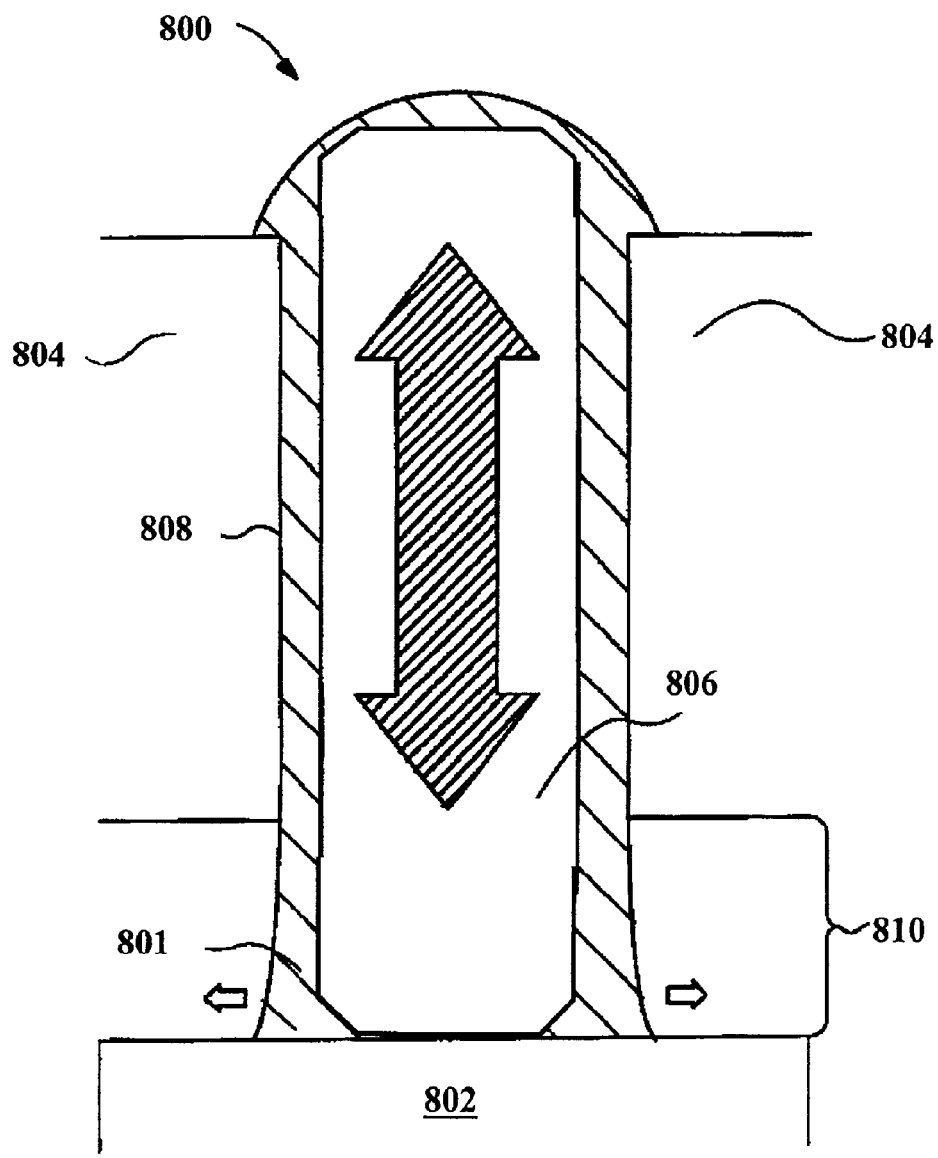
FIG. 8 is a cross-sectional schematic diagram of the joint structure according to an embodiment of the present invention.

FIG. 8 shows a cross-sectional diagram of a joint structure 800 between a device carrier and a plug, which are held together by a filler material 801 such as solder or epoxy. This diagram includes a substrate 802, a device carrier 804, and a plug 806. The device carrier 804 is connected to the substrate 802 by inserting the plug 806 into a through hole 808, which is provided in the device carrier 804. The plug 806 closely fit into the through hole 808, so the clearance is large enough for plug to slip through the hole 808 without much insertion force, yet small enough so that proper bonding can occur without excess filler. The ends of the plug 806 may have a sheared or lathed off with flatter bottom having corners cut (grinded) or chamfered. Through hole 808 is provided in the assembly to confine epoxy or solder at the joint 800 and form a channel to allow plug 806 to slide up and down during movement of the device carrier 804 relative to the substrate 802. The clearance in FIG. 8 is exaggerated in FIG. 8 for the sake of clarity. The joint structure 800 allows maximum adhesive contact area between the device carrier 804 and the plug 806. After the device carrier 804 is aligned spatially and angularly, a filler material, such as solder or epoxy, may fill the clearance between the plug 806 and the hole 808 and (optionally) the gap 810 between the device carrier 804 and the substrate 802 to secure the device carrier 804 to the substrate 802. Alternatively, an adhesive filler may be put in the hole 808 first and then the plug 806 may be inserted into the hole 808 to make sure that the adhesive, e.g., expoxy or solder, gets onto the surface of the plug 806.

Figure 9A:
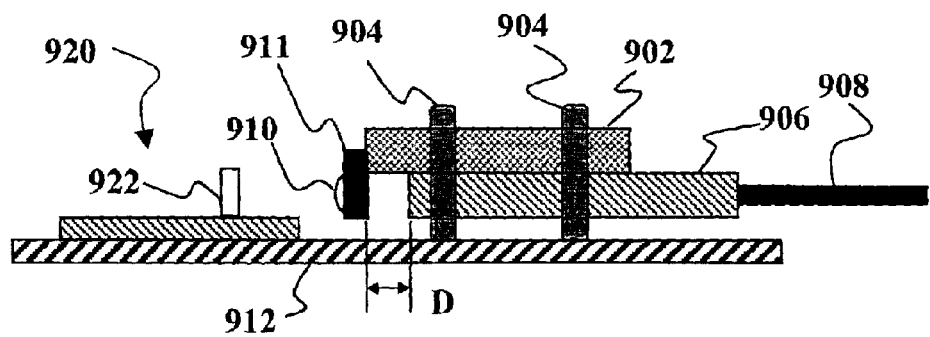
FIG. 9A is a side elevation schematic diagram of an apparatus having one or more fibers aligned to one or more lenses according an embodiment of the present invention.
Figure 9B:
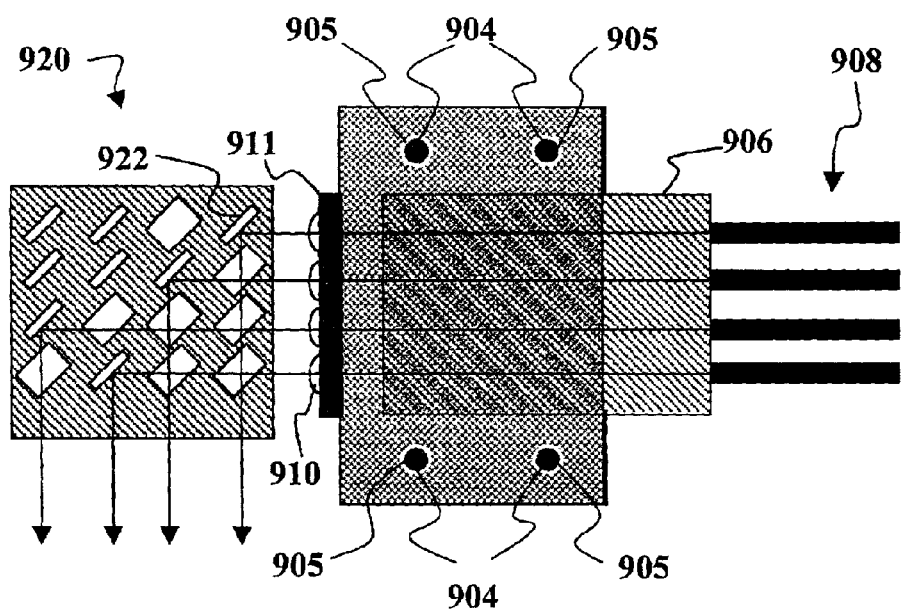
FIG. 9B is a plan view of the apparatus of FIG. 9A.

FIGS. 9A and 9B illustrate an apparatus according to an embodiment of the present invention utilized to align one or more waveguides. The apparatus 900 includes a carrier 902. One or more plugs 904 that fit into holes 905 are used to allow the carrier 902 to be positioned at an arbitrary 6-axis position. The plugs 904 may be in the form of through-pins or balls with the cross-sections providing maximum contact area such as round or square cross-sections. The carrier 902 and the plugs 904 may be made from materials with low thermal expansion such as ceramics, glasses, silicon or metals, e.g., Kovar®. Kovar® is a registered trademark of Westinghouse Electric & Manufacturing Company of Pittsburgh, Pa. These materials limit the expansion effects with the temperature fluctuations, so the overall thermal performance is enhanced. To enhance soldering techniques, the plugs 904 could also be plated for soldering or are made from the soldering materials such as tin-lead and gold-tin. In certain optical applications it is desirable to maintain this position after cure to within +/−0.2 um over a temperature range of −10° C. to 75° C. The geometry of the carrier 902 is such that stresses are balanced minimizing warping, shifting or other movement that would violate the +/−0.2 um positional specification. In such applications it is preferable to make the carrier 902 from a UV transparent material such as a ceramic or glass material. In a preferred embodiment, the carrier 902 is made from fused silica or Pyrex®, which is transparent to UV and allows the adhesive to dry securing the plugs 904. Pyrex® is a registered trademark of Corning Incorporated of Corning, N.Y. The use of ceramic allows a wide selection of materials with a variety of thermal properties. Low cure shrink and low CTE adhesives are used to attach parts and lock the carrier 902 and associated parts into the desired position. Examples of suitable adhesives include 3400 series epoxies available from Electronic Materials, Inc. of Breckenridge, Colo. or Dymax OP-61 adhesive available from Dymax Corporation of Torrington Conn.

The carrier 902 serves as a common reference point for components in an optical package such as the apparatus 900. By way of example, such a package may include the ceramic carrier 902, the plugs 904, an adhesive (not shown) an optional a mounting substrate 912 and one or more waveguides. As used herein, the term "waveguides" generally refers to components for manipulating optical signals. As two of many possible examples of waveguides, FIG. 9 depicts a lens array having one or more lenses 910, and a fiber array 906 having one or more optical fibers 908. The lenses 910 may be in the form of an array held in position relative to each other by a holder 911. Other examples of waveguides include optically transparent media. Waveguides may also include active and/or passive optical elements. Such elements may be capable of attenuating, amplifying, switching, translating or routing photonic energy in one or more frequencies.

In the apparatus 900 there are no indirect attachments that could contribute to tolerance and junction stack ups as well as the need for additional processes and control. The apparatus 900 may be used to align waveguides such as the optical fibers 908 and/or lenses 910 to one or more optical devices 920 that is mounted to the substrate 912. By way of example, and without loss of generality, the optical device 920 may be a MEMS optical switch having one or more light-deflecting elements 922 that move into position to deflect optical signals to or from the fibers 908. Additional examples of optical devices include, but are not limited to, active devices, passive devices, attenuators, signal detectors, amplifiers, diffractive elements, multiplexers, etc.

One embodiment, among others, of a method for the alignment of waveguides proceeds as follows:
1. The carrier 902 is attached to fiber array 906 with the ends of one or more of the fibers 908 at a known distance "D" from an end of the carrier 902.
2. The lenses 910 are aligned to the fiber array 906, and then attached to carrier 902, e.g., with an adhesive, soldering, or welding.
3. The collimator assembly is aligned using the plugs 904 then mounted to the substrate 912 e.g., using an adhesive, soldering, or welding.
4. One or more of the plugs 904 may be tacked to the substrate 912 to maintain the alignment of the lenses 910 and fiber array 906 with respect to the optical device 920.
5. The adhesives used to attach the fiber array 906 and lenses 910 to the carrier 902 may optionally be cured, e.g. by heat curing, depending on the selection of adhesives used.

In this method, it is desirable to provide at least three through holes in the carrier 902 to accommodate three plugs 904. Through holes are provided in the carrier to confine epoxy or solder at the joints between the device carrier and the plugs and form a channel for the pins to slide up and down during movement of the carrier 902 relative to the substrate 912. The plugs 904 may thus be used as an adjustable spacer between the carrier 902 and the substrate 912. The plugs 904 may be inserted through the holes from the top of the carrier 902. The carrier 902 is aligned spatially and angularly relative to the substrate 912. The plugs 904 may be tacked to the substrate 912 and the carrier 902 to secure the alignment of the carrier 902. An optional filler material (not shown) may fill the gap between the carrier 902 and the substrate 912. The plugs 904 and/or the filler material secure the carrier 902 to the substrate 912. The plugs 904 and the holes have cross-sections that provide maximum contact area such as square/square cross-sections or round/round cross-sections.

Furthermore, the method described above may be altered, e.g., by providing holes for the plugs 904 in the substrate 912 instead of the carrier 902. In addition, holes for plugs may be provided in both the carrier 902 and the substrate 912 to facilitate attachment and alignment of optical devices to the substrate 912 to compensate any arbitrary lateral and angular misalignment during the final mounting.

Figure 10A:
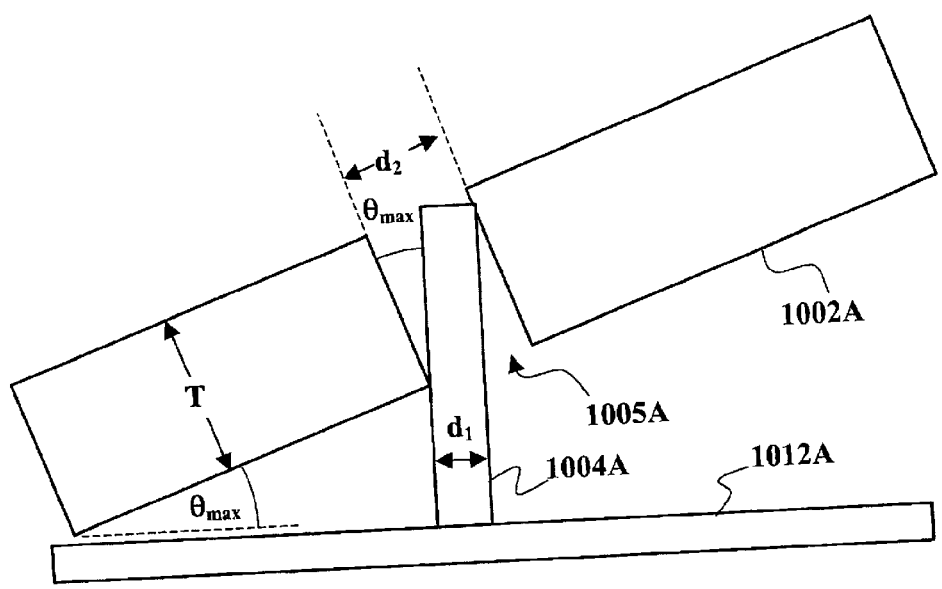
FIGS. 10A–10B are cross-sectional schematic diagrams illustrating adjustment of the orientation of a carrier using plugs that fit into holes.
Figure 10B:
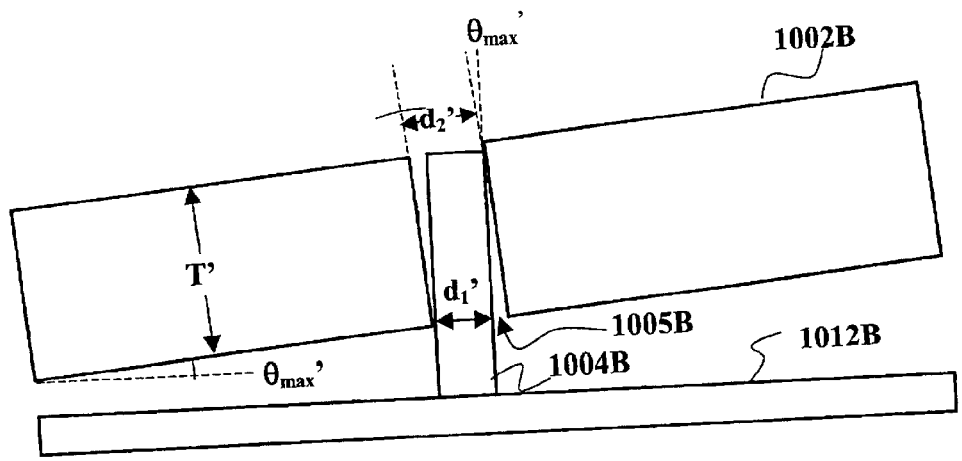

In the various embodiments of the invention, the amount of angular adjustment depends, in part in the dimensions of the plugs, holes and carrier. In some embodiments, it may be desirable for the plugs to fit loosely in the holes to facilitate adjustment of the orientation of the carrier. The schematic diagrams depicted in FIG. 10A and FIG. 10B illustrate some of the ways, among others, that the dimensions of the plugs and holes can affect the range of angular adjustment of the orientation of a carrier using plugs that fit into holes. In FIGS. 10A–10B carriers 1002A, 1002B are respectively aligned with respect to substrates 1012A, 1012B, using plugs in the form of one or more substantially cylindrical pins 1004A, 1004B that respectively fit into one or more substantially cylindrical holes 1005A, 1005B. The holes 1005A, 1005B are characterized by hole diameters $d_2$, $d_2'$ and hole thicknesses T, T'. The term "cylindrical", as used herein, means that the holes 1005A, 1005B have substantially constant cross-sections along the hole thickness T, T'. The cross-sections of the pins 1004A, 1004B and holes 1005A, 1005B may be circular or any other suitable shape, e.g., rectangular, square, elliptical, oval, triangular, hexagonal, etc, to name but a few of many possible shapes. The pins 1004A, 1004B and the holes 1005A, 1005B may have the same type of cross-sectional shape. Alternatively, the cross-sectional shapes of the pins 1004A, 1004B and holes 1005A, 1005B may be different.

The pins 1004A, 1004B are characterized by pin diameters $d_1$, $d_1'$ that are generally less than the corresponding hole diameters $d_2$, $d_2'$. The pins 1004A, 1004B may also be characterized by a pin length that may be greater than the hole thicknesses T, T'. In the examples depicted in FIGS. 10A–10B, the hole thicknesses T, T' are substantially the same as the thickness of the corresponding carriers 1002A, 1002B. More generally, the hole thicknesses T, T' may be different, e.g., as a result of countersinks, counterbores, or other geometry of the hole.

Referring to FIG. 10A, the carrier 1002A may tilted at an angle θ with respect to the substrate 1012A due to the smaller pin diameter $d_1$ compared to the hole diameter $d_2$.

The tilt angle θ may have a maximum value $\theta_{max}$ that depends on $d_1$, $d_2$ and T. The maximum tilt angle $\theta_{max}$ may take on any value, e.g. from 0° to 45°. By way of example, for a single pin 1004A extending all the way through a hole 1005A, the maximum angle of tilt $\theta_{max}$ may be shown to be given by:

$$\theta_{max} = \tan^{-1}\left[\frac{d_2 - \frac{d_1}{\cos\theta_{max}}}{T}\right]$$

For small values of the angle $\theta_{max}$, e.g., $\theta_{max} < 10°$, cos $\theta_{max} \approx 1$ and the equation above may be simplified to read:

$$\theta_{max} \approx \tan^{-1}\left[\frac{d_2 - d_1}{T}\right]$$

Thus, by appropriately choosing the pin diameter $d_1$, the hole diameter $d_2$ and the hole thickness T, the desired range of tilt angles θ may be suitably engineered. Note, for example, that the value of $\theta_{max}$ depends partly on the difference between the pin diameter and hole diameter ($d_2 - d_1$). As shown in FIG. 10B, the value of $\theta_{max}$ becomes smaller as the pin diameter $d_1'$ approaches the hole diameter $d_2'$. The difference ($d_2 - d_1$) may depend, for example, on the type of adhesive that is used to secure the pins 1004A, 1004B to the holes 1005A, 1005B. Such considerations may place a practical limit on ($d_2 - d_1$) of between about 0.04 microns (μm) up to about 6 millimeters (mm). Practical pin diameters $d_1$ may be as small as, for example, from 0.8 mm. The hole thickness T, T' may range from about 0.009" (about 0.2 mm) up to about 5 mm. In a particular example, a carrier 1002A having holes 1005A of thickness T of about 1.50 mm and diameter $d_2$ of about 1.4 mm, may be aligned using pins of diameter $d_1$ of about 1.27 mm up to a maximum angle $\theta_{max}$ of about 5°. The above discussion and associated equations do not cover all possible configurations of the pins and holes. For example, the pin might not extend all the way through the hole. In such a case the net effect would be to reduce the effective hole thickness T, T', which would tend to increase the value of $\theta_{max}$. Furthermore, in the case of non-circular hole cross-sections, there may be additional constraints on the range of angular adjustment with respect to two or more axes.

In practical applications involving alignment of optical devices it is possible to use more than one pin and one hole. In such cases, the maximum angle of tilt $\theta_{max}$ may depend on other factors such as the spacing between pins or the spacing between holes. Furthermore, the maximum tilt angle may depend, in part, on the order of the alignment steps. For example, the pins might not be attached to the substrate until after the carrier has been aligned. Alternatively, the pins might be fixed to the substrate before aligning the carrier. In the former case, the distance between the holes (as measured along the carrier) is fixed but there is some range of adjustment in the distance between the pins (as measured along the substrate). In the latter case, the distance between the holes and the distance between the pins are both substantially fixed. Furthermore, in such cases, there may be different maximum tilt angles about different axes. Those of skill in the art may determine the ranges of the relevant parameters for a desired range of tilt angles empirically through routine experimentation and/or through suitable application of geometry.

Embodiments of the present invention to provide for optoelectronic packages having high performance characteristics and low manufacturing cost and that may be actively aligned. Embodiments of the present invention reduce the requirement of dimensional tolerances on parts or completely eliminate the need for precision spacers. Embodiments of the invention prevent the shrinkage of epoxy in gaps between bonding surfaces during temperature variations. Embodiments of the present invention also provide solutions to compensate for arbitrary lateral and angular misfits during final mounting. Furthermore, embodiments of the present invention provide solid contacts and create a rigid aligned structure between modules. Embodiments of the apparatus and methods for attachment and alignment of optical modules allow sufficient angular and lateral offset as the fixture secured to a substrate. Furthermore, embodiments of the present invention reduce the requirement of dimensional tolerances on parts or completely eliminate the need for precision spacers.

While the above is a complete description of the preferred embodiment of the present invention, it is possible to use various alternatives, modifications and equivalents. It will be clear to one skilled in the art that the above embodiment may be altered in many ways without departing from the scope of the invention. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. An apparatus for attachment and alignment of optical devices to a motherboard comprising:
   a) at least one device carrier;
   b) at least three adjustable plugs configured to fit into openings in the device carrier or in the motherboard; and
   c) a filler material that fills the space between the device carrier and the motherboard;
   d) wherein the plugs closely fit into the openings, such that a clearance is large enough for the plugs to slip through the openings without much insertion force and the clearance is small enough that the plugs may be held in place by the force of friction.

2. The apparatus of claim 1 wherein the clearance between the plugs and the openings is 50 μm or less.

3. The apparatus of claim 2 wherein the carrier is transparent to ultraviolet light.

4. The apparatus of claim 3 wherein the carrier is made from a ceramic material.

5. An apparatus for aligning one or more waveguides to one or more optical devices, comprising:
   a carrier having one or more through holes, the carrier being adapted to receive the one or more waveguides; and
   one or more plugs, each of which is sized to be received in one or more of the through holes,
   wherein the carrier is transparent to ultraviolet light.

6. The apparatus of claim 5 wherein the carrier is made from a ceramic or glass material.

7. The apparatus of claim 6 wherein the carrier is made from fused silica or Pyrex.

8. An apparatus for aligning one or more waveguides to one or more optical devices, comprising:
   a carrier having one or more through holes, the carrier being adapted to receive the one or more waveguides; and one or more plugs, each of which is sized to be received in one or more of the through holes, wherein the one or more waveguides include an optically transparent medium, a fiber array having one or more optical fibers, or a lens array having one or more lenses.

9. The apparatus of claim 8 further comprising a waveguide attached to the carrier.

10. The apparatus of claim 9 wherein the one or more plugs are inserted into the one or more holes.

11. The apparatus of claim 10 wherein one or more of the plugs are attached to the carrier.

12. The apparatus of claim 11 wherein one or more of the plugs are attached to a substrate.

13. The apparatus of claim 8, further comprising a substrate.

14. The apparatus of claim 8 wherein the holes are sized such that the plugs have sufficient clearance to slide within the holes without excessive insertion force.

15. The apparatus of claim 8 wherein the plug is characterized by a smaller diameter than the corresponding hole such that an angle of the carrier relative to a substrate may be adjusted by up to 45°.

16. The apparatus of claim 8 wherein the angle of the carrier relative to a substrate may be adjusted by up to about 5°.

17. An apparatus for aligning one or more waveguides to one or more optical devices, comprising:

a carrier having one or more through holes, the carrier being adapted to receive the one or more waveguides; and one or more plugs, each of which is sized to be received in one or more of the through holes, wherein the one or more waveguides include, one or more active and/or passive optical elements.

18. The apparatus of claim 17 wherein the one or more active and/or passive optical elements are capable of attenuating, amplifying, switching, translating or routing photonic energy in one or more frequencies.

19. A method for alignment of one or more waveguides, comprising:

inserting a plug into one or more through holes in a carrier;

attaching one or more waveguides to the carrier;

aligning the carrier to align the one or more waveguides with respect to an optical device attached to a substrate; and tacking one or more of the plugs to the substrate to maintain the alignment of the one or more waveguides with respect to the optical device.

20. The method of claim 19 wherein the one or more waveguides are attached to the carrier using an adhesive, soldering or welding.

21. The method of claim 20, further comprising heat curing or UV curing an adhesive used to attach the one or more waveguides to the carrier.

22. The method of claim 19, wherein the waveguide includes, one or more active and/or passive optical elements.

23. The method of claim 22, wherein the optical elements are capable of attenuating, amplifying, switching, translating or routing photonic energy in one or more frequencies.

24. The method of claim 19, further comprising tacking one or more of the plugs to the carrier.

25. The method of claim 24 wherein the plugs are tacked to the substrate using an adhesive.

26. The method of claim 19 wherein the plug is characterized by a smaller diameter than the corresponding hole such that an angle of the carrier relative to the substrate may be adjusted by up to 45°.

27. The method of claim 26 wherein the angle of the carrier relative to the substrate may be adjusted by up to about 5°.

28. The method of claim 19 wherein the carrier is made from a ceramic material.

29. The method of claim 19 wherein the waveguide includes an optically transparent medium, a fiber array having one or more optical fibers, or a lens array having one or more lenses.

* * * * *